United States Patent
Kang et al.

(10) Patent No.: US 11,239,222 B2
(45) Date of Patent: Feb. 1, 2022

(54) COOLED OPTICAL TRANSMISSION MODULE DEVICE AND METHOD OF MANUFACTURING THE SAME

(71) Applicant: ELECTRONICS AND TELECOMMUNICATIONS RESEARCH INSTITUTE, Daejeon (KR)

(72) Inventors: Eun Kyu Kang, Gwangju (KR); Jong Jin Lee, Gwangju (KR); Sang Jin Kwon, Gwangju (KR); Won Bae Kwon, Gwangju (KR); Dae Seon Kim, Gwangju (KR); Soo Yong Jung, Gwangju (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/081,536

(22) Filed: Oct. 27, 2020

(65) Prior Publication Data

US 2021/0125975 A1    Apr. 29, 2021

(30) Foreign Application Priority Data

Oct. 28, 2019  (KR) .................. 10-2019-0134402
Mar. 10, 2020  (KR) .................. 10-2020-0029886

(51) Int. Cl.
*H01L 25/16*    (2006.01)
*H01L 23/38*    (2006.01)
*H04B 10/50*    (2013.01)
*H01L 23/10*    (2006.01)
*H01L 31/18*    (2006.01)
*H01L 23/053*   (2006.01)

(52) U.S. Cl.
CPC .......... *H01L 25/167* (2013.01); *H01L 23/053* (2013.01); *H01L 23/10* (2013.01); *H01L 23/38* (2013.01); *H01L 31/186* (2013.01); *H04B 10/501* (2013.01)

(58) Field of Classification Search
CPC ....... H01L 25/167; H01L 23/38; H01L 23/10; H01L 31/186; H01L 23/053; H04B 10/501
See application file for complete search history.

(56) References Cited

U.S. PATENT DOCUMENTS 8,774,568 B2 *  7/2014  Han ................. G02B 6/4271
                                               385/14
9,148,226 B2 *  9/2015  Sato ................ G02B 6/4265

(Continued)

*Primary Examiner* — John P. Dulka

(57) ABSTRACT

Provided is a cooled optical transmission module device including a silicon wafer having a plurality of platform mounting grooves, each of which serves as a space for mounting in which an optical transmission platform therein, a thermoelectric cooler bonded to the platform mounting groove to transfer heat to outside, the optical transmission platform provided on the thermoelectric cooler and configured to output an optical signal by generating and reflecting the optical signal, a dielectric sub-mount bonded to the platform mounting groove of the silicon wafer and electrically connected to the mounted optical transmission platform, and a cover configured to cover the platform mounting groove of the silicon wafer and seal the platform mounting groove while providing an electric path.

16 Claims, 10 Drawing Sheets

HEAT EMISSION

(56) References Cited

U.S. PATENT DOCUMENTS

| | | | |
|---|---|---|---|
| 9,541,714 B2* | 1/2017 | Lim | G02B 6/4257 |
| 9,857,535 B2 | 1/2018 | Heo et al. | |
| 10,348,399 B2* | 7/2019 | Teranishi | H04B 10/032 |
| 10,403,671 B2 | 9/2019 | Rossi | |
| 10,680,404 B2* | 6/2020 | Komatsu | H01S 5/02257 |
| 2006/0128059 A1* | 6/2006 | Ahn | H01L 23/38 |
| | | | 438/108 |
| 2008/0285110 A1* | 11/2008 | Terashima | H01S 5/02326 |
| | | | 359/245 |
| 2012/0128290 A1* | 5/2012 | Han | G02B 6/4206 |
| | | | 385/14 |
| 2015/0372759 A1* | 12/2015 | Lim | G02B 6/4246 |
| | | | 398/88 |
| 2019/0385992 A1* | 12/2019 | Lopez | H01L 25/04 |
| 2020/0075437 A1* | 3/2020 | Nozu | H01L 31/0203 |
| 2021/0175681 A1* | 6/2021 | Murakami | H01L 23/04 |

\* cited by examiner

COOLED OPTICAL TRANSMISSION MODULE DEVICE AND METHOD OF MANUFACTURING THE SAME

CROSS-REFERENCE TO RELATED APPLICATION

This application claims priority to and the benefit of Korean Patent Applications No. 2019-0134402, filed on Oct. 28, 2019, and No. 2020-0029886, filed on Mar. 10, 2020, the disclosures of which are incorporated herein by reference in its entirety.

BACKGROUND

1. Field of the Invention

The present invention relates to a cooled optical transmission module device and a method of manufacturing the same, and more particularly, to a cooled optical transmission module device, in which an optical transmission module that requires temperature control is manufactured by assembling photo/optical devices and then finally dicing, and a method of manufacturing the same.

2. Discussion of Related Art

Recently, as data traffic is increasing, an optical transmission/reception module capable of transmitting a large amount of data at a high speed without distortion of signals has been rapidly developing, and price competitiveness through mass production of the optical transmission/reception modules is becoming important.

In a cooled transmitter optical subassembly (TOSA) module of which optical wavelength stabilization is important in the conventional optical network, a package and an optical transmission platform are manufactured through separate manufacturing processes and individual packaging, which is not beneficial in mass production.

SUMMARY OF THE INVENTION

The present invention is directed to solving the existing problems by providing a cooled optical transmission module device that is beneficial in mass production by applying a wafer level packaging process to a manufacturing process of a cooled optical transmission module which prioritizes optical wavelength stabilization in the existing 5G and 6G local network wavelength division (LWDM), dense wavelength division multiplexing (DWDM), and optical networks having optical wavelength bands of 100 GHz and 50 GHz.

The technical objectives of the present invention are not limited to the above, and other objectives may become apparent to those of ordinary skill in the art on the basis of the following description.

According to an aspect of the present invention, there is provided a cooled optical transmission module device including a silicon wafer having a plurality of platform mounting grooves, each of which serves as a space for mounting an optical transmission platform therein, a thermoelectric cooler bonded to the platform mounting groove to transfer heat to outside, the optical transmission platform provided on the thermoelectric cooler and configured to output an optical signal by generating and reflecting the optical signal, a dielectric sub-mount bonded to the platform mounting groove of the silicon wafer and electrically connected to the mounted optical transmission platform, and a cover configured to cover the platform mounting groove of the silicon wafer and seal the platform mounting groove while providing an electric path.

In the silicon wafer, the platform mounting groove may be formed through a wet etching process, and the silicon wafer may include a silicon material having a thermal conductivity of 149 W/(m·k).

The silicon wafer may be coated with a solder material or an epoxy material for bonding the cover around a periphery of an upper portion of the platform mounting groove for a sealing process for an internal airtightness of the platform mounting groove.

The optical transmission platform may include: a photoelectric device configured to output an optical signal to a lens, the lens configured to collimate the optical signal output through the photoelectric device, an optical device configured to reflect the optical signal collimated through the lens at a certain angle, a monitoring photo diode configured to detect light transmitted without being reflected by the optical device, and a temperature detector configured to detect an operating temperature of the photoelectric device.

The cover may be provided with a light transmitting coating film formed on an upper surface and a lower surface of the cover corresponding to a position of the optical signal reflected through the optical device so as to correspond to optical wavelengths of the reflected optical signals.

The dielectric sub-mount may include a first flat portion formed with a metal pattern and disposed at a height equal to a height of the optical transmission platform mounted in the platform mounting groove when the dielectric sub-mount is mounted in the platform mounting groove, a second flat portion formed with a metal pattern to be in electrical contact with the cover while supporting the cover for sealing the platform mounting groove, and an inclined portion formed with a metal pattern and electrically connecting the first flat portion to the second flat portion.

The plurality of metal patterns of the dielectric sub-mount may include a radio frequency (RF) line for connection of a high-speed signal, a power supply line of the thermoelectric cooler, and a low frequency signal line connected to sense a monitoring photo diode and a temperature detector.

The dielectric sub-mount may be formed of a glass material.

The cover may include a sealing pad provided at a periphery of a lower surface of the cover and configured to be in contact with and then seal the platform mounting groove of the silicon wafer, a redistribution layer (RDL) formed at one side of an upper surface of the cover, a metal via path formed to pass through the cover while being connected to the RDL, and a metal pad connected to the metal via path so as to be in contact with the metal pattern of the dielectric sub-mount when the silicon wafer is sealed.

According to another aspect of the present invention, there is provided a method of manufacturing a cooled optical transmission module, the method including generating a silicon wafer formed with a platform mounting groove as a space for mounting an optical transmission platform in the silicon wafer, bonding a thermoelectric cooler to the platform mounting groove of the generated silicon wafer, bonding the optical transmission platform on the thermoelectric cooler bonded to the platform mounting groove, bonding a dielectric sub-mount having a solder bump to the platform mounting groove at a position in which the thermoelectric cooler is not bonded, electrically connecting the optical transmission platform to the dielectric sub-mount, and bonding a cover to the silicon wafer to seal the silicon wafer and electrically connecting the optical transmission platform.

The method may further include checking operating characteristics of the optical transmission module at a wafer level and performing dicing.

The performing of the dicing may use one of laser dicing, saw dicing, and scribing and breaking.

The generating of the silicon wafer may include forming the platform mounting groove through a wet etching process.

The generating of the silicon wafer may further include coating the silicon wafer with a material for bonding the cover around a periphery of an upper portion of the platform mounting groove for a sealing process to maintain an internal airtightness of the platform mounting groove.

The bonding of the cover to the silicon wafer to seal the silicon wafer and electrically connecting the optical transmission platform may include forming a light transmitting coating film on an upper surface and a lower surface of the cover corresponding to a position of an optical signal reflected through an optical device to correspond to optical wavelengths of the reflected optical signal The above-described configurations and operations of the present invention will become more apparent from embodiments described in detail below with reference to the drawings.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Advantages and features of the present invention and methods for achieving them will be made clear from embodiments described in detail below with reference to the accompanying drawings. However, the present invention may be embodied in many different forms and should not be construed as being limited to the embodiments set forth herein. Rather, these embodiments are provided so that this disclosure will be thorough and complete and will fully convey the scope of the present invention to those of ordinary skill in the technical field to which the present invention pertains. The present invention is defined by the claims. Meanwhile, terms used herein are for the purpose of describing the embodiments and are not intended to limit the present invention. As used herein, the singular forms include the plural forms as well unless the context clearly indicates otherwise. The term "comprise" or "comprising" used herein does not preclude the presence or addition of one or more other elements, steps, operations, and/or devices other than stated elements, steps, operations, and/or devices.

Figure 1:
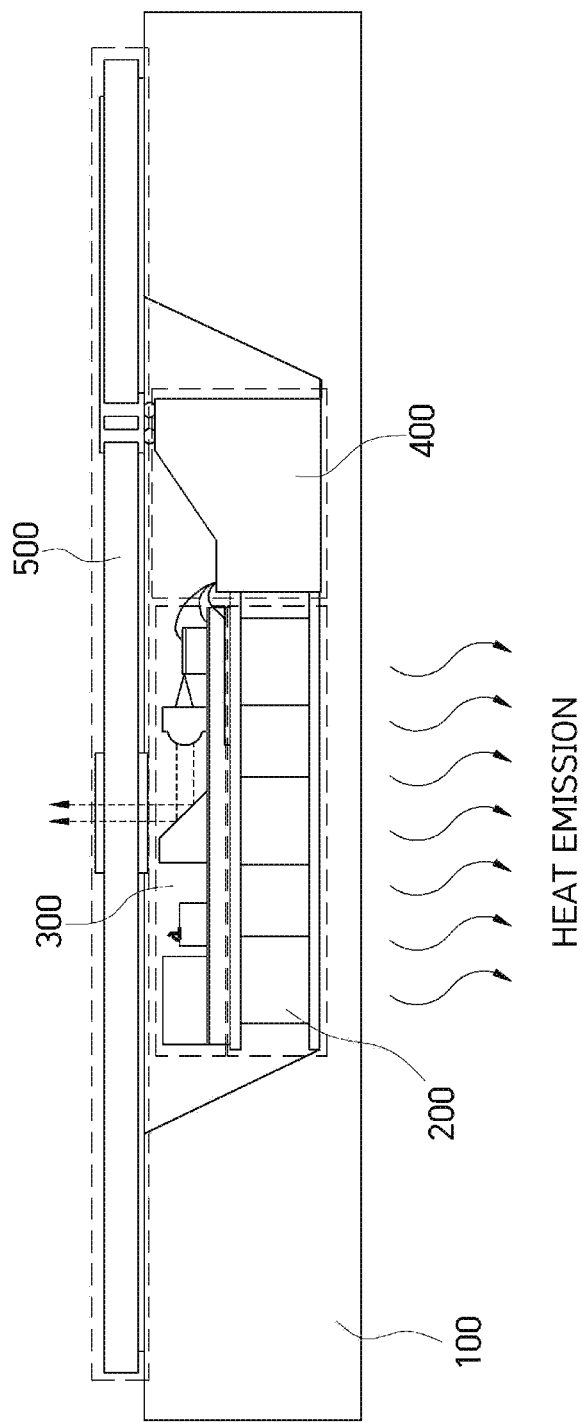
FIG. 1 is a cross-sectional view for describing a cooled optical transmission module device according to an embodiment of the present invention.

FIG. 1 is a cross-sectional view for describing a cooled optical transmission module device according to an embodiment of the present invention.

Referring to FIG. 1, the cooled optical transmission module device according to the embodiment of the present invention includes a silicon wafer 100, a thermoelectric cooler 200, an optical transmission platform 300, a dielectric sub-mount 400, and a cover 500.

Figure 3:
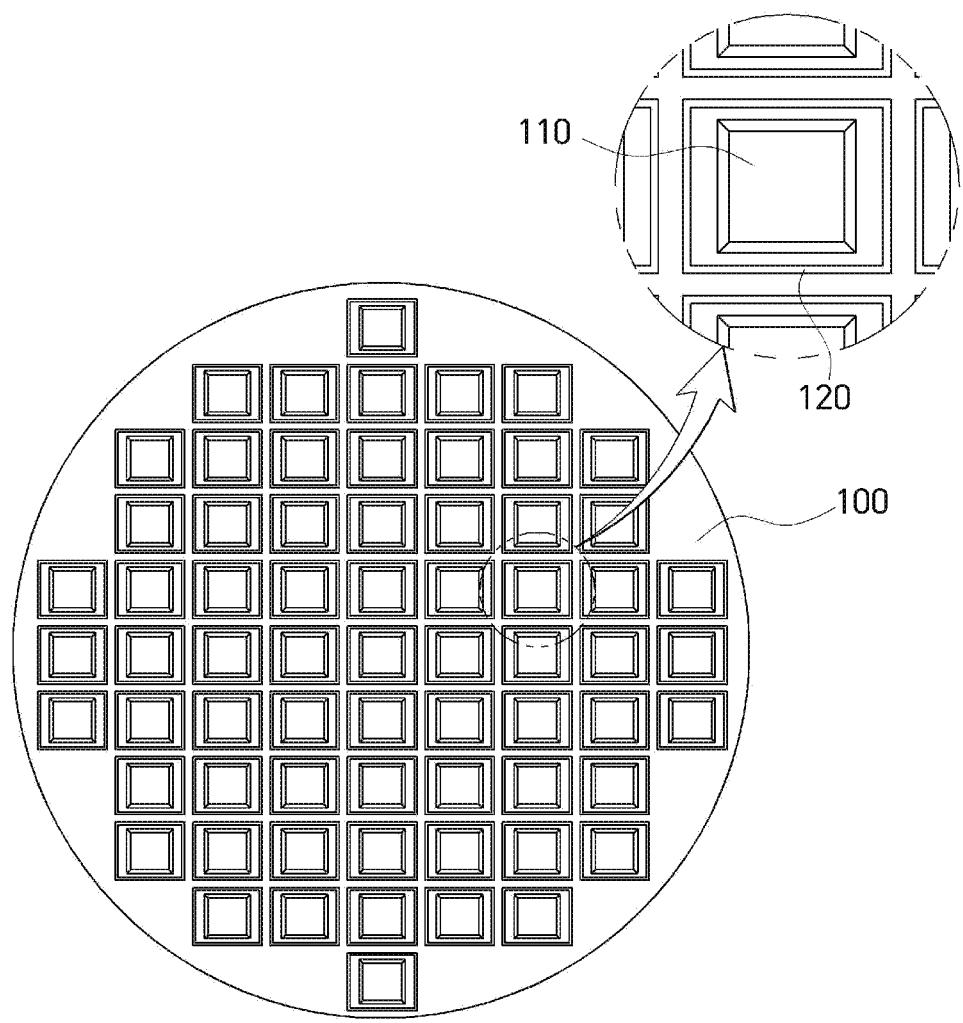
FIG. 3 is a schematic diagram for describing a silicon wafer of FIG. 1.

The silicon wafer 100 as an SI wafer is provided with a plurality of spaces in which an optical transmission platform is mounted. As shown in FIG. 3, the silicon wafer provides a platform mounting groove 110, in which the thermoelectric cooler 200, the optical transmission platform 300, and the dielectric sub-mount 400 are mounted, through a simple wet etching process. The silicon wafer 100 is preferably formed of a silicon material having a thermal conductivity of 149 W/(m·k). Accordingly, the thermoelectric cooler 200 is beneficial in heat dissipation.

In addition, the silicon wafer 100 may be coated with a solder material or epoxy material, which is an adhesive material 120 for bonding the cover 500 having an interposer, on a periphery of an upper side of the platform mounting groove 110 for a sealing process for maintaining the internal airtightness of the platform mounting groove 110.

The thermoelectric cooler 200 is inserted into the platform mounting groove 110 and operates in response to heat generated from the optical transmission platform 300 to transfer heat from the optical transmission platform 300 to the outside. The thermoelectric cooler 200 may be provided using a thermoelectric cooling device employing the Peltier effect that heat is absorbed when a current flows through a heterojunction of two metals, but the thermoelectric cooler is not limited thereto and various thermoelectric devices may be used without limitation.

The optical transmission platform 300 is provided on the thermoelectric cooler 200 and includes a photoelectric device 310 that outputs an optical signal, a lens 320 that determines an irradiation position of the optical signal output through the photoelectric device 310, an optical device (a mirror) 330 that reflects the optical signal transmitted from the photoelectric device 310 through the lens 320, a monitoring photodiode 340 that detects an optical signal, which passes through the optical device 330 without being reflected by the optical device 330, among the optical signals output from the photoelectric device 310, and a temperature measurer 350 for measuring the temperature of the photoelectric device 310.

The photoelectric device 310 outputs an optical signal to the lens 320.

The lens 320 collimates optical signals output through the photoelectric device 310.

The optical device 330 reflects the optical signal collimated by the lens 320 at an arbitrary angle. In the present embodiment, the optical device 330 is a 45-degree mirror by which a path of the optical signal is changed by 90 degrees and the optical signal passes through the cover 500 formed with a light-transmitting coating film and finally precedes to the outside.

The monitoring photo diode (hereinafter, referred to as "mPD", 340) detects the light transmitted without being reflected by the optical device 330 at 45° such that the amount of light output from the photoelectric device 310 is measured.

The temperature detector 350 detects the operating temperature of the photoelectric device 310. On the basis of the temperature of the photoelectric device 310 detected as such, the thermoelectric cooler 200 operates to transfer heat generated from the photoelectric device 310 to the outside. Such a configuration allows the operating temperature of the photoelectric device 310 to be kept constant so that the output optical wavelength of the photoelectric device 310 is stabilized.

The dielectric sub-mount 400 includes a first flat portion 401 disposed at the same height as the optical transmission platform 300 mounted in the platform mounting groove 110 of the silicon wafer 100 when the dielectric sub-mount 400 is mounted in the platform mounting groove 110 of the silicon wafer 100; a second flat portion 402 configured to be in contact with a lower portion of the cover 500 that seals the platform mounting groove 110 in which the thermoelectric cooler 200, the optical transmission platform 300 (a transmitter optical subassembly (TOSA) platform, and the dielectric sub-mount 400 formed with the metal pattern are mounted; and an inclined portion 403 connecting the first flat portion 401 to the second flat portion 402.

Figure 2:
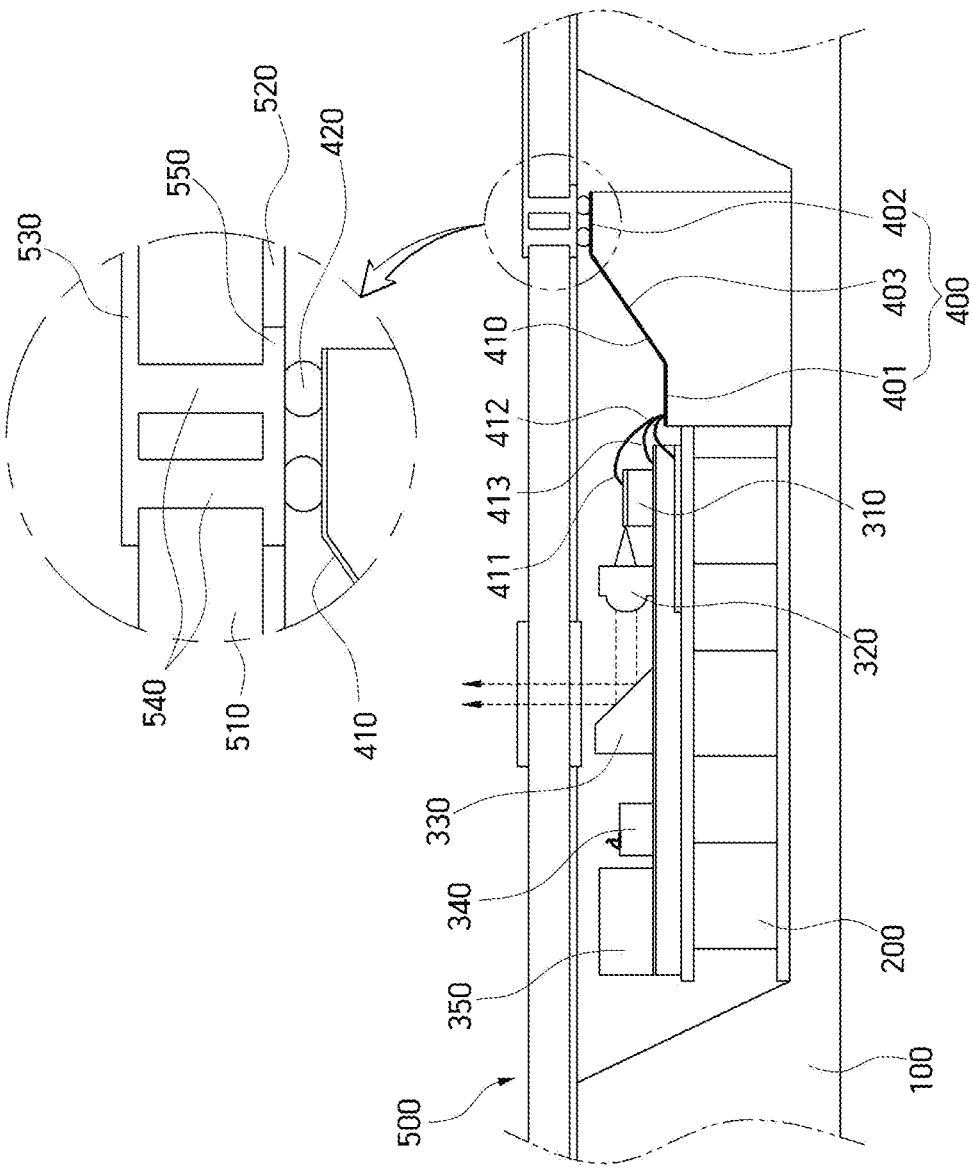
FIG. 2 is a reference diagram for describing the detailed configuration of FIG. 1.

The dielectric sub-mount 400 is provided with a plurality of metal patterns 410. The plurality of metal patterns 410 include a radio frequency (RF) line 411 for high-speed signal connection, a thermoelectric cooler power supply line 412, and low frequency signal lines 413 and 414 connected to sense the mPD 340 and the temperature detector 350. Here, the signal lines 413 and 414 are preferably connected to an electrode of the cover 500 through a solder bump 420 as shown in FIG. 2.

Here, the dielectric sub-mount 400 is preferably formed of a material (e.g., glass) that does not easily transfer heat in order to minimize heat transfer to the photoelectric device 310 by a Au wire 413.

Figure 4:
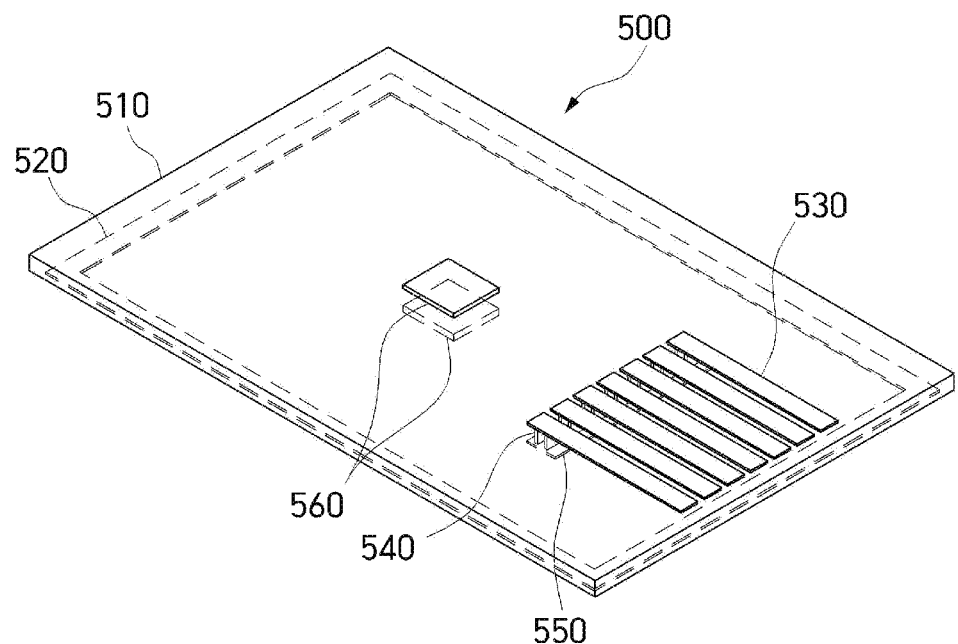
FIG. 4 is a perspective view for describing a cover of FIG. 1.
Figure 5:
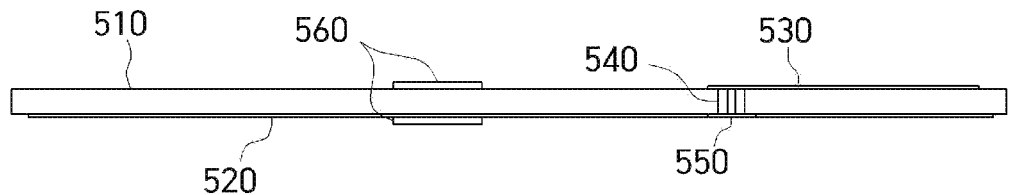
FIG. 5 is a side view for describing a cover of FIG. 1.

Referring to FIGS. 4 and 5, the cover 500 is provided in a plate shape and formed of glass and covers and seals the platform mounting groove 110 of the silicon wafer 100 while providing an electrical path.

To this end, the cover 500 includes a body 510, a sealing pad 520, a redistribution layer (RDL) 530, a metal via path 540, and a metal pad 550.

The body 510 is formed of a glass material and seals the platform mounting groove 110 of the silicon wafer 100.

The sealing pad 520 is provided at a periphery of a lower surface of the cover 500 and serves to be in contact with and then seal an upper portion of the platform mounting groove 110 of the silicon wafer 100.

The RDL 530, the metal via path 540, and the metal pad 550 are formed of metal so as to be electrically connected to the dielectric sub-mount 400 while enabling hermetic sealing.

The RDL 530 is formed at one side of an upper surface of the cover 500, the metal via path 540 is formed to pass through the cover 500 while being connected to the RDL 530, and the metal pad 550, which is connected to the metal via path 540, comes into contact with the metal pattern 410 of the dielectric sub-mount 400 when the silicon wafer 100 is sealed using the cover 500.

Here, the electrical connection to the photoelectric device 310 in the optical transmission module is achieved in the order of the RDL 530, the metal via path 540, the metal pad 550, the solder bump 420, the dielectric sub-mount 400, a gold (Au) wire 413, the optical transmission platform 300, and the thermoelectric cooler 200.

In addition, the cover 500 is provided with an anti-reflection coating portion 550 formed at a bottom and a top of the cover 500 corresponding to an output area of optical signals reflected through the optical device 330 to correspond to optical wavelengths of the optical signals.

Accordingly, according to the embodiment of the present invention, the cover 500 is formed of a glass material that allows the inside of the optical transmission module to be visually observed so that alignment between the silicon wafer and the cover 500 and wafer bonding is easily performed using a vision device using light in a visible light band.

Figure 6A:
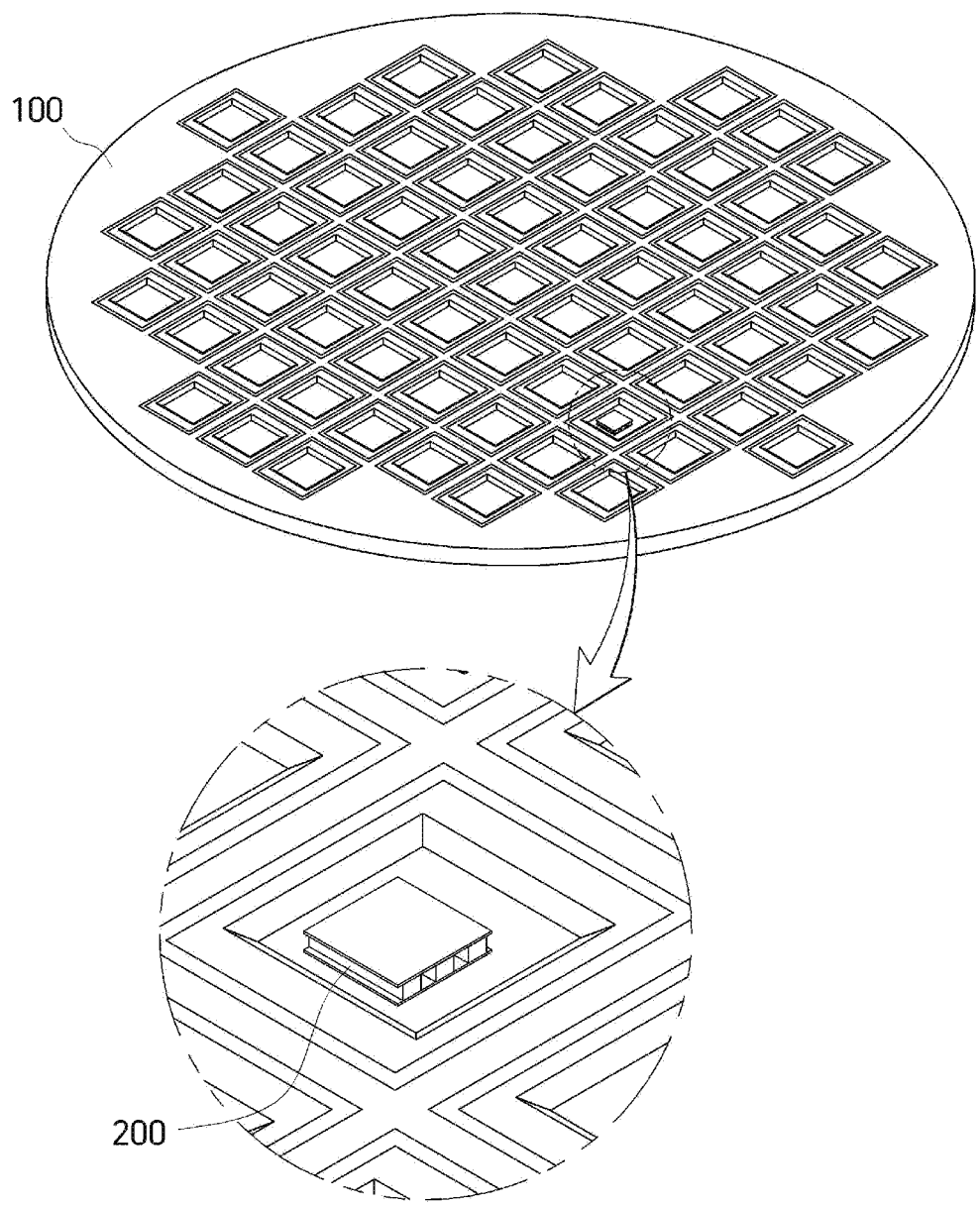
FIGS. 6A to 6E are packaging process diagrams for describing a manufacturing process of a cooled optical transmission module device according to an embodiment of the present invention.
Figure 6B:
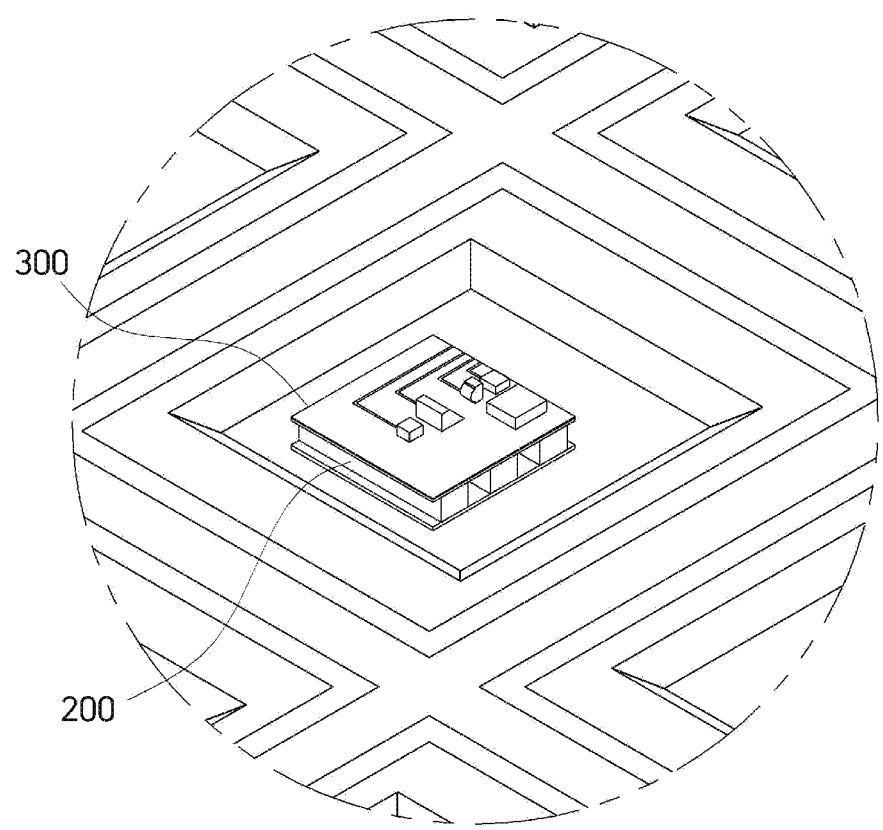
Figure 6C:
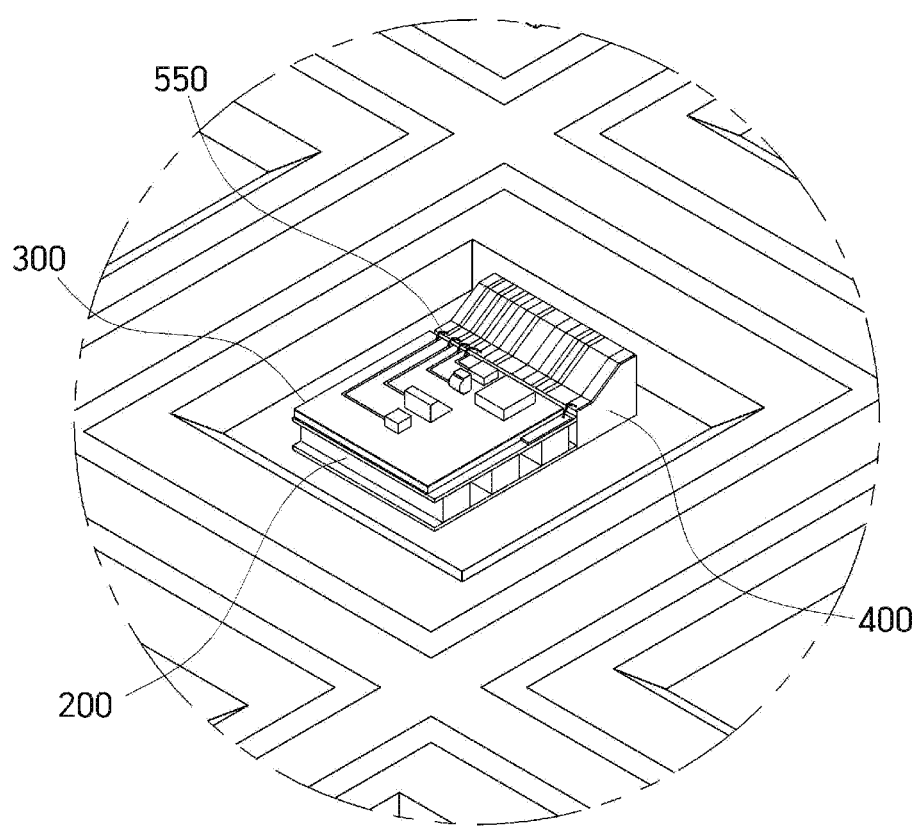
Figure 6D:
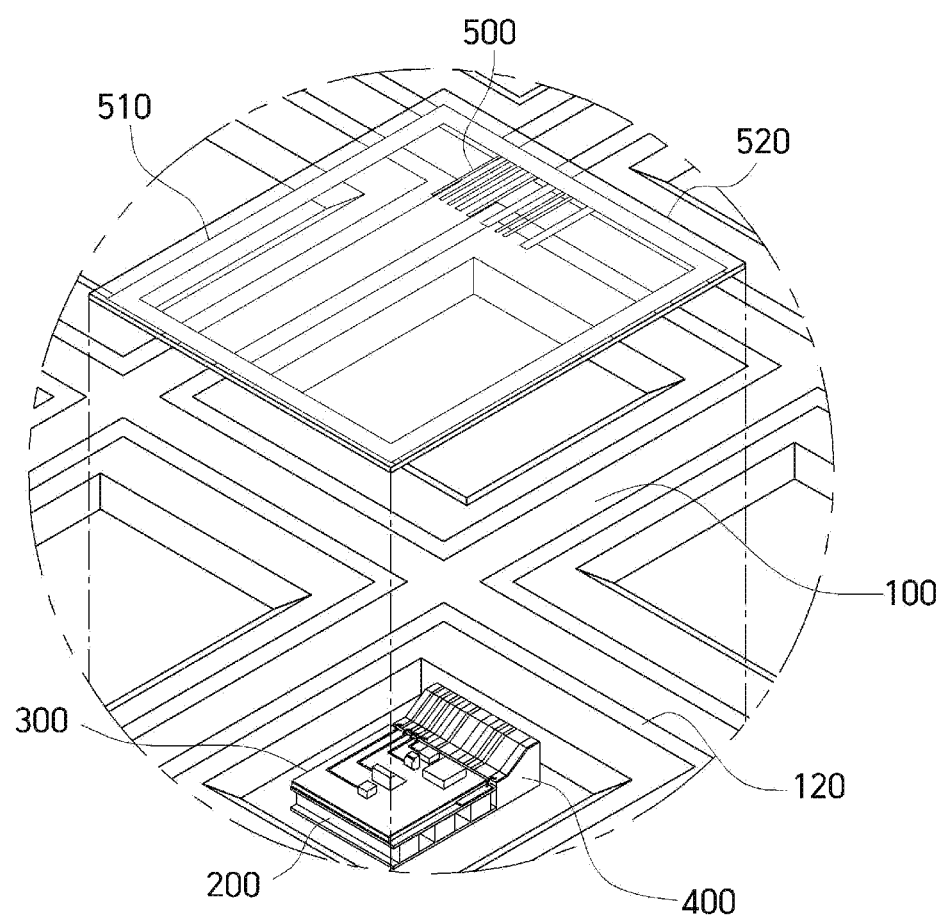
Figure 6E:
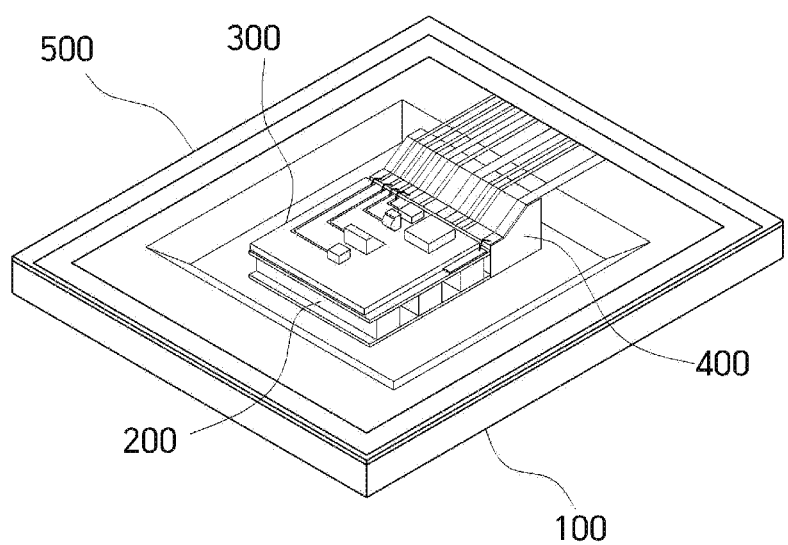
Figure 7:
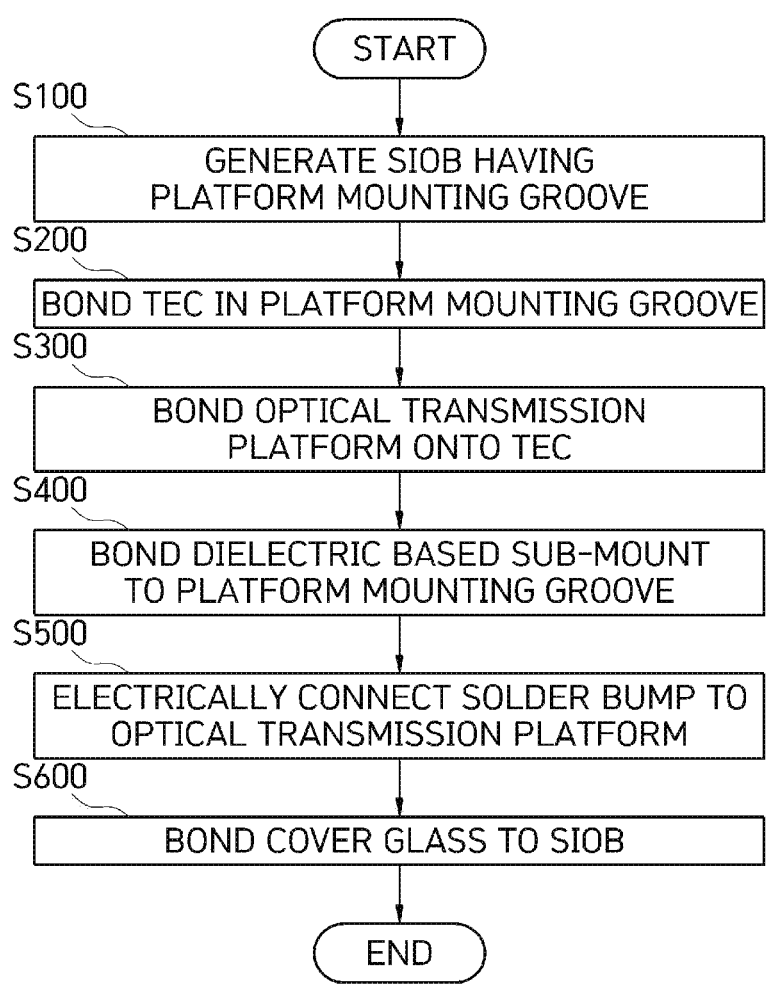
FIG. 7 is a flowchart showing a method of manufacturing a cooled optical transmission module according to an embodiment of the present invention.

FIGS. 6A to 6E are packaging process diagrams for describing a manufacturing process of a cooled optical transmission module device according to an embodiment of the present invention, and FIG. 7 is a flowchart for describing a processing sequence of a cooled optical transmission module according to an embodiment of the present invention.

Hereinafter, a method of manufacturing a cooled optical transmission module according to an embodiment of the present invention, in detail, the entire process of manufacturing the cooled optical transmission module using a wafer level packaging process will be described with reference to FIGS. 3, 6A to 6E, and 7.

First, referring to FIG. 3, the silicon wafer 100 is a silicon wafer having the platform mounting groove 110 serving as a space for mounting the optical transmission platform 300 therein, wherein the platform mounting groove 110 is formed through a wet etching method (S100).

Thereafter, referring to FIG. 6A, the thermoelectric cooler 200 is bonded to the platform mounting groove 110 of the silicon wafer 100 using a die bonder or a flip chip bonder (S200). In this case, the bonding material may be provided as a product that performs thermal curing while facilitating heat transfer from a lower portion of the thermoelectric cooler 200 to silicon.

Subsequently, referring to FIG. 6B, the optical transmission platform 300 is bonded to the thermoelectric cooler 200 bonded to the platform mounting groove 110 of the silicon wafer 100 (S300). In this case, the bonding of the optical transmission platform 300 may be performed in two ways. One way is to bond the entire optical transmission platform 300 onto the thermoelectric cooler 200, and the other way is to bond an aluminum nitride (AlN) substrate soldered with the photoelectric device 310 onto the thermoelectric cooler 200 and then mount the mPD 340, the temperature detector 350, the optical device (a 45-degree mirror) 330, and a lens.

Thereafter, referring to FIG. 6C, the dielectric sub-mount 400 provided with the solder bump 420 is bonded to the platform mounting groove 110 of the platform mounting groove 110 at a position in which the thermoelectric cooler 200 is bonded (S400).

Subsequently, referring to FIG. 6D, the optical transmission platform 300 and the dielectric sub-mount 400 are bonded by the Au wire 413 therebetween so that the solder bump 420 is electrically connected to the optical transmission platform 300 (S500), and the cover 500 is bonded to the silicon wafer 100 (S600). Here, the hermetic sealing is achieved in two ways. One way is to overlap the lower metal pattern of the cover 500 and the solder of the silicon wafer 100 and melt the solder using a laser light having a wavelength that can transmit the cover 500 to achieve hermetic sealing, and the other way is to transfer heat to the cover 500 by applying heat to a chip tool of a flip chip bonder to melt the solder material of the silicon wafer 100 to achieve bonding.

According to the embodiment of the present invention, in order to overcome limitations in mass production of the existing cooled optical transmission module, a cooled optical module structure to which a wafer level packaging process is applicable and a method of manufacturing the same are proposed so that productivity is remarkably improved through mass production process and thus the price of the product is lowered.

Meanwhile, the dicing process may be performed after checking the operating characteristics of the optical transmission module at a wafer level. Here, the dicing processing may be achieved in various ways. For example, one of laser dicing, saw dicing, and scribing and breaking may be used.

After completing the dicing, referring to FIG. 6E, finally, an operating characteristic test is performed so that the optical transmission module is completed.

The cooled optical transmission module according to the embodiment of the present invention described above is a module having a single-channel, but the present invention is not limited thereto. For example, a cooled multi-channel optical transmission module may be manufactured by expanding the number of channels of the photoelectric device 310.

As is apparent from the above, an assembly process is performed on a silicon wafer (silicon optical bench (SiOB)) having a space for mounting an optical transmission platform in the sequence of a photoelectric device (a laser diode: LD and an mPD), an optical device (a mirror and a lens), a thermoelectric device (a thermoelectric cooler), a glass interposer (a cover), and a thermal sensor (a temperature detector) so that the manufacturing process can be simplified and the productivity can be remarkably increased.

Although the present invention has been described in detail above with reference to the exemplary embodiments, those of ordinary skill in the technical field to which the present invention pertains should be able to understand that various modifications and alterations can be made without departing from the technical spirit or essential features of the present invention. Therefore, it should be understood that the disclosed embodiments are not limiting but illustrative in all aspects. The scope of the present invention is defined not by the above description but by the following claims, and it should be understood that all changes or modifications derived from the scope and equivalents of the claims fall within the scope of the present invention.

What is claimed is:

1. A cooled optical transmission module device comprising:
    a silicon wafer having a plurality of platform mounting grooves, each of which serves as a space for mounting an optical transmission platform therein;
    a thermoelectric cooler bonded to the platform mounting groove to transfer heat to outside;
    the optical transmission platform provided on the thermoelectric cooler and configured to output an optical signal by generating and reflecting the optical signal;
    a dielectric sub-mount bonded to the platform mounting groove of the silicon wafer and electrically connected to the mounted optical transmission platform; and
    a cover configured to cover the platform mounting groove of the silicon wafer and seal the platform mounting groove while providing an electric path.

2. The cooled optical transmission module device of claim 1, wherein, in the silicon wafer, the platform mounting groove is formed through a wet etching process.

3. The cooled optical transmission module device of claim 1, wherein the silicon wafer includes a silicon material having a thermal conductivity of 149 W/(m·k).

4. The cooled optical transmission module device of claim 1, wherein the silicon wafer is coated with a solder material or an epoxy material for bonding the cover around a periphery of an upper portion of the platform mounting groove for a sealing process for an internal airtightness of the platform mounting groove.

5. The cooled optical transmission module device of claim 1, wherein the optical transmission platform includes:
    a photoelectric device configured to output an optical signal to a lens;
    a lens configured to collimate the optical signal output through the photoelectric device;
    an optical device configured to reflect the optical signal collimated through the lens at a certain angle;
    a monitoring photo diode configured to detect light transmitted without being reflected by the optical device; and
    a temperature detector configured to detect an operating temperature of the photoelectric device.

6. The cooled optical transmission module device of claim 5, wherein the cover is provided with a light transmitting coating film formed on an upper surface and a lower surface of the cover corresponding to a position of the optical signal reflected through the optical device so as to correspond to optical wavelengths of the reflected optical signals.

7. The cooled optical transmission module device of claim 1, wherein the dielectric sub-mount includes:
    a first flat portion formed with a metal pattern and disposed at a height equal to a height of the optical transmission platform mounted in the platform mounting groove when the dielectric sub-mount is mounted in the platform mounting groove;
    a second flat portion formed with a metal pattern to be in electrical contact with the cover while supporting the cover for sealing the platform mounting groove; and
    an inclined portion formed with a metal pattern and electrically connecting the first flat portion to the second flat portion.

8. The cooled optical transmission module device of claim 7, wherein the plurality of metal patterns of the dielectric sub-mount include a radio frequency (RF) line for connection of a high-speed signal, a power supply line of the thermoelectric cooler, and a low frequency signal line connected to sense a mPD and a temperature detector.

9. The cooled optical transmission module device of claim 7, wherein the dielectric sub-mount is formed of a glass material.

10. The cooled optical transmission module device of claim 1, wherein the cover includes:
    a sealing pad provided at a periphery of a lower surface of the cover and configured to be in contact with and then seal the platform mounting groove of the silicon wafer;
    a redistribution layer (RDL) formed at one side of an upper surface of the cover;
    a metal via path formed to pass through the cover while being connected to the RDL; and
    a metal pad connected to the metal via path so as to be in contact with the metal pattern of the dielectric sub-mount when the silicon wafer is sealed.

11. A method of manufacturing a cooled optical transmission module, the method comprising:
- generating a silicon wafer formed with a platform mounting groove serving as a space for mounting an optical transmission platform in the silicon wafer;
- bonding a thermoelectric cooler to the platform mounting groove of the generated silicon wafer;
- bonding the optical transmission platform on the thermoelectric cooler bonded to the platform mounting groove;
- bonding a dielectric sub-mount having a solder bump to the platform mounting groove at a position in which the thermoelectric cooler is not bonded;
- electrically connecting the optical transmission platform to the dielectric sub-mount; and
- bonding a cover to the silicon wafer to seal the silicon wafer and electrically connecting the optical transmission platform.

12. The method of claim 11, further comprising checking operating characteristics of the optical transmission module at a wafer level and performing dicing.

13. The method of claim 12, wherein the performing of the dicing uses one of laser dicing, saw dicing, and scribing and breaking.

14. The method of claim 11, wherein the generating of the silicon wafer includes forming the platform mounting groove through a wet etching process.

15. The method of claim 14, wherein the generating of the silicon wafer further includes coating the silicon wafer with a material for bonding the cover around a periphery of an upper portion of the platform mounting groove for a sealing process to maintain an internal airtightness of the platform mounting groove.

16. The method of claim 11, wherein the bonding of the cover to the silicon wafer to seal the silicon wafer and electrically connecting the optical transmission platform includes forming a light transmitting coating film on an upper surface and a lower surface of the cover corresponding to a position of an optical signal reflected through a optical device to correspond to optical wavelengths of the reflected optical signal.

* * * * *